(12) United States Patent
Abouda et al.

(10) Patent No.: US 12,132,480 B2
(45) Date of Patent: Oct. 29, 2024

(54) CIRCUITS FOR INVERTERS AND PULL-UP/PULL-DOWN CIRCUITS

(71) Applicant: NXP USA, INC., Austin, TX (US)

(72) Inventors: Pascal Kamel Abouda, Saint Lys (FR); Badr Guendouz, Colomiers (FR); Hiba Mediouni, Toulouse (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/160,605

(22) Filed: Jan. 27, 2023

(65) Prior Publication Data

US 2023/0253964 A1 Aug. 10, 2023

(30) Foreign Application Priority Data

Feb. 8, 2022 (EP) ..................................... 22305133

(51) Int. Cl.
*H03K 19/003* (2006.01)
(52) U.S. Cl.
CPC .............................. *H03K 19/00315* (2013.01)
(58) Field of Classification Search
CPC ..... H03K 19/018521; H03K 19/00315; H03K 3/35625; H03K 17/162; H03K 17/687; H03K 19/00361; H03K 19/20; H03K 3/012; H03K 17/145; H03K 19/018507; H03K 3/0372; H03K 3/356104; H03K 2217/0081; H03K 19/0185; H03K 19/0013; H03K 17/6872; H03K 17/693; H03K 17/22; H03K 17/666; H03K 17/063; H03K 17/04126; G05F 1/575; G11C 19/28
See application file for complete search history.

(56) References Cited

U.S. PATENT DOCUMENTS

| 4,992,924 | A | * | 2/1991 | Gousset | ........... H03K 17/04126 |
| | | | | | 327/478 |
| 6,031,403 | A | | 2/2000 | Gersbach | |
| 10,110,231 | B1 | | 10/2018 | Graves | |
| 2006/0164135 | A1 | * | 7/2006 | Myono | ................... H02M 1/08 |
| | | | | | 327/112 |
| 2008/0094044 | A1 | * | 4/2008 | Ji | ........................... G05F 1/575 |
| | | | | | 323/268 |

(Continued)

FOREIGN PATENT DOCUMENTS

GB 2244400 11/1991

*Primary Examiner* — Lincoln D Donovan
*Assistant Examiner* — Tyler J Pereny

(57) ABSTRACT

A circuit is disclosed, comprising: an inverter comprising first and second inverter transistors, each having: a gate terminal connected in common to a drive node, a source terminal, connected to respective first and second voltage rails, and a drain terminal connected to a common first resistor, wherein an inverter output node is connected between the first resistor and the drain terminal of a shorting one of the transistors; a tying transistor connected between the drive node and the voltage rails to which the shorting transistor is connected; a biasing circuit connected to the tying transistor's control terminal and configured to be controlled by a local drive signal and bias the tying transistor control terminal to a voltage such that the tying transistor ties the drive node of the relevant voltage rail in response to the drive signal having a first state; and a circuit for providing the local drive signal.

21 Claims, 12 Drawing Sheets

(56) References Cited

U.S. PATENT DOCUMENTS

2010/0013519 A1* 1/2010 Yoshii .................... H03K 19/20
                                                      326/112
2012/0206179 A1   8/2012 Miyazaki
2021/0265910 A1*  8/2021 Kuo ................ H03K 19/00315

* cited by examiner

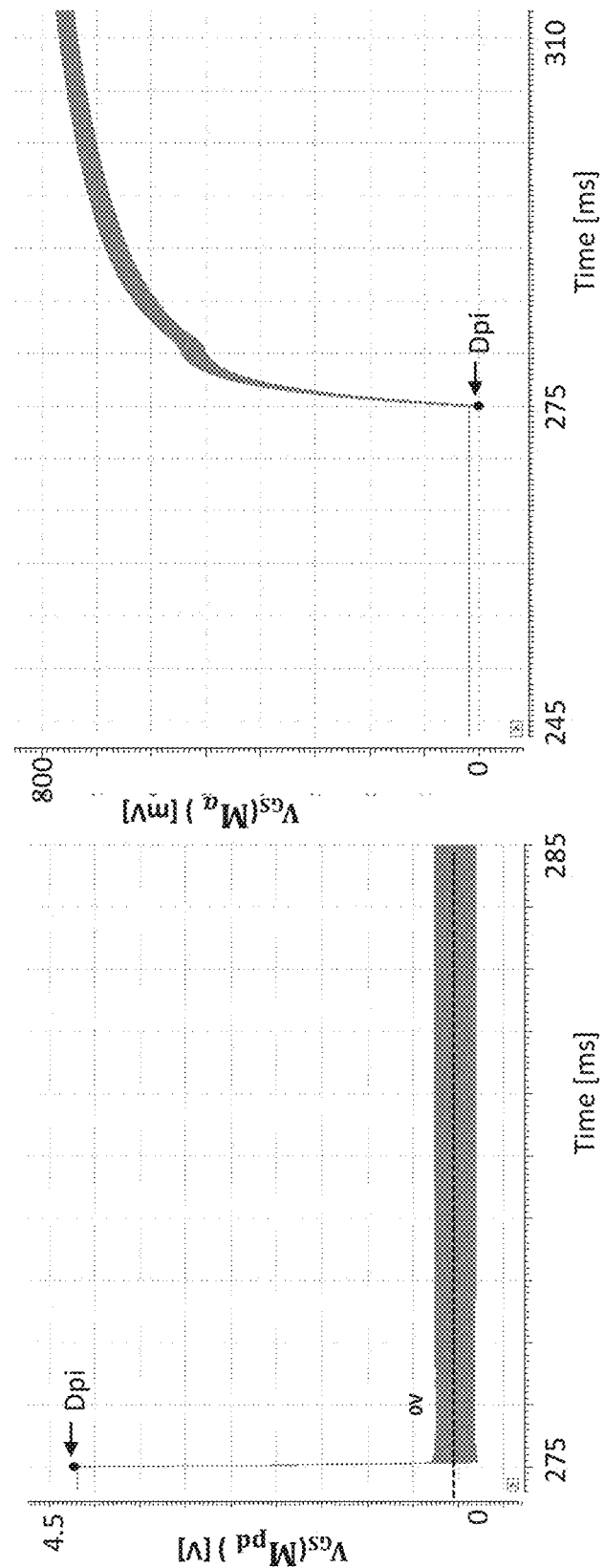

CIRCUITS FOR INVERTERS AND PULL-UP/PULL-DOWN CIRCUITS

CROSS-REFERENCE TO RELATED APPLICATIONS

This application claims the priority under 35 U.S.C. § 119 of European Patent application no. 22305133.5, filed on 8 Feb. 2022, the contents of which are incorporated by reference herein.

FIELD

The present disclosure relates to circuits for inverters, and pull-up/pull-down circuits, for applications such as gate drivers.

BACKGROUND

In some inverter applications, noise, transients or interference can result in a current flowing across the two switching transistors of the inverter, for instance during switching operations. In general such a current is undesirable. In some circumstances the current, in conjunction with noise transience or interference, may result in the inverter not performing as intended.

SUMMARY

According to a first aspect of the present disclosure, there is disclosed a circuit, comprising: an inverter comprising a first inverter transistor and a second inverter transistor, each having a gate terminal connected in common to a drive node, each having a source terminal, connected to a first voltage rail and a second voltage rail respectively, and each having a drain terminal connected to a common first resistor, the inverter having inverter output node between the first resistor and the drain terminal of a shorting one of the first and second inverter transistors; a tying transistor connected between the drive node and the one of the first and second voltage rail to which the shorting one of the first and second inverter transistors is connected, the tying transistor having a tying transistor control terminal; a biasing circuit connected to the tying transistor control terminal and configured to be controlled by a local drive signal, the biasing circuit being configured to bias the tying transistor control terminal to a voltage such that the tying transistor ties the drive node of the one of the first and second voltage rail in response to the drive signal having a first state; and a local drive circuit configured to provide the local drive signal. The tying circuit may thereby prevent unintentional or unwanted flipping or changes of state of the inverter transistors in the presence of noise, and at the same time the common first resistor may act to limit or reduce unwanted cross-conduction during switching of the inverter transistors.

In one or more embodiments the biasing circuit comprises a series arrangement of a biasing transistor and a voltage divider, the series arrangement being connected between the first voltage rail and the second voltage rail, wherein the voltage divider has a divider output node connected to the tying transistor control terminal, and wherein the biasing transistor comprises a control terminal configured to be connected to the local drive signal. The biasing circuit may thereby ensure that the tying transistor switches state in the presence of noise before the inverter switch would be biased to reach a switching voltage.

In one or more embodiments the voltage divider comprises a second resistor and a third resistor with the divider output node therebetween, wherein the second resistor has a resistance value which is within 10% of a resistance value of the third first resistor. The voltage divider may thus produce a voltage which is approximately halfway between the first and second voltage rails.

In one or more embodiments the second resistor has a resistance value which is at least 4 times a resistance value of the first resistor. By providing a relatively high resistance of the resistors in the voltage divider, the currents dissipation therein may be reduced or minimised. In particular, in one or more embodiments the first resistor has a resistance value of at least 500 kOhm.

In one or more embodiments the inverter output node is connected between the first resistor and the source terminal of the second inverter transistor, and the first state is a voltage low state.

In one or more embodiments the second voltage rail is a floating ground voltage, and the first voltage rail is in a range of 3-5 V higher than the floating ground voltage.

In one or more embodiments the first inverter transistor is an NMOS transistor. The tying transistor may be a PMOS transistor.

In one or more embodiments in which the circuit is operable as a gate-driver circuit, the circuit further comprises a gate pull-down transistor having a control terminal connected to the output, wherein the circuit is operable as a gate. The circuit may further comprise a further drive circuit.

In one or more embodiments the further drive circuit comprises a drive transistor connected in series with a fourth resistor with a drive node therebetween, the drive transistor connected between the first voltage rail and drive node, and the fourth resistor being connected between the drive node and the second voltage rail, wherein the drive circuit is configured to receive an input signal at a control terminal of the drive transistor, and provide a gate driver drive signal at the drive node. The local drive circuit may be a duplicate of the further drive circuit.

According to another aspect of the present invention there is provided an inverter circuit, comprising: an inverter, comprising a series arrangement of a first switch and a second switch with a first resistor therebetween, the first switch and the second switch each having a control terminal connected in common to a drive node, the series arrangement being connected between a first voltage rail and a second voltage rail, the inverter having an output node between the first resistor and a shorting one of the first and second switches; a tying switch connected between the drive node and the one of the first and second voltage rail to which the shorting one of the first and second switches is connected, the tying switch having a tying control terminal; a biasing circuit connected to the tying control terminal and configured to be controlled by a local drive signal, the biasing circuit being configured to bias the tying switch control terminal to a voltage such that the tying switch ties the drive node of the one of the first and second voltage rail in response to the drive signal having a first state; and a local drive circuit configured to provide the local drive signal.

In one or more embodiments the first switch, second switch and tying switch are each an MOS transistor. In one or more such embodiments the first switch is a PMOS transistor and the second switch is an NMOS transistor. In one or more such embodiments the tying switch is an NMOS transistor.

Inverter circuit may comprise a further drive circuit.

In one or more embodiments the further drive circuit comprises a drive transistor connected in series with a fourth resistor with a drive node therebetween, the drive transistor connected between the first voltage rail and drive node, and the fourth resistor being connected between the drive node and the second voltage rail, wherein the drive circuit is configured to receive an input signal at a control terminal of the drive transistor, and provide a gate driver drive signal at the drive node. The local drive circuit may be a duplicate of the further drive circuit.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which

FIGS. 10 and 11 shows the resulting gate-source voltages, plotted against time for the pulldown transistor and the upper balancing transistor, for a conventional pulldown control circuit comprising an inverter and drive circuit;

Figure 1:
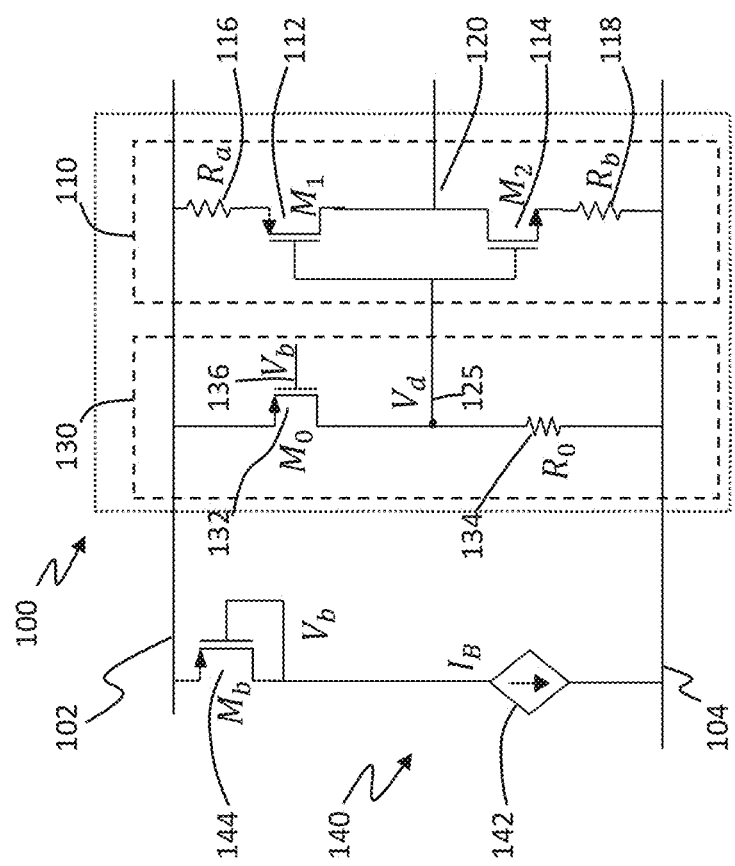
FIG. 1 shows an example of a circuit useful for understanding the present disclosure.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

FIG. 1 shows an example of a circuit 100 useful for understanding the present disclosure. The circuit 100 comprises an inverter 110 which has transistors, M1 and M2, 112 and 114 having commonly connected drains at an inverter output node 120, and having their respective sources connected to first and second voltage rails 102, 104 through resistors Ra and Rb 116, 118. The inverter is driven by a signal Vd at an drive node 125 which may also be referred to as an inverter drive node, connected to the gate terminal of M1 and M2. The signal Vd is provided by a drive circuit 130 comprising a resistor M0 132 connected between the drive node and a first voltage rail, together with a resistor R0 134 connected between the drive node and the second rail. That is to say the transistor M0 has its source terminal connected to the first voltage rail 102, and its drain terminal connected to the drive node 125. It has a drive transistor control terminal 136 connected to an input signal voltage Vb. In this figure, the input signal voltage Vb, is determined by a separate circuit comprising a controlled current source 142 connected, in series with a transistor Mb 144, the control terminal of which is connected to its drain and provides the input signal voltage Vb. The skilled person will appreciate that the controlled current source may be provided by a current mirror or other suitable circuit, depending on the application.

Figure 2:
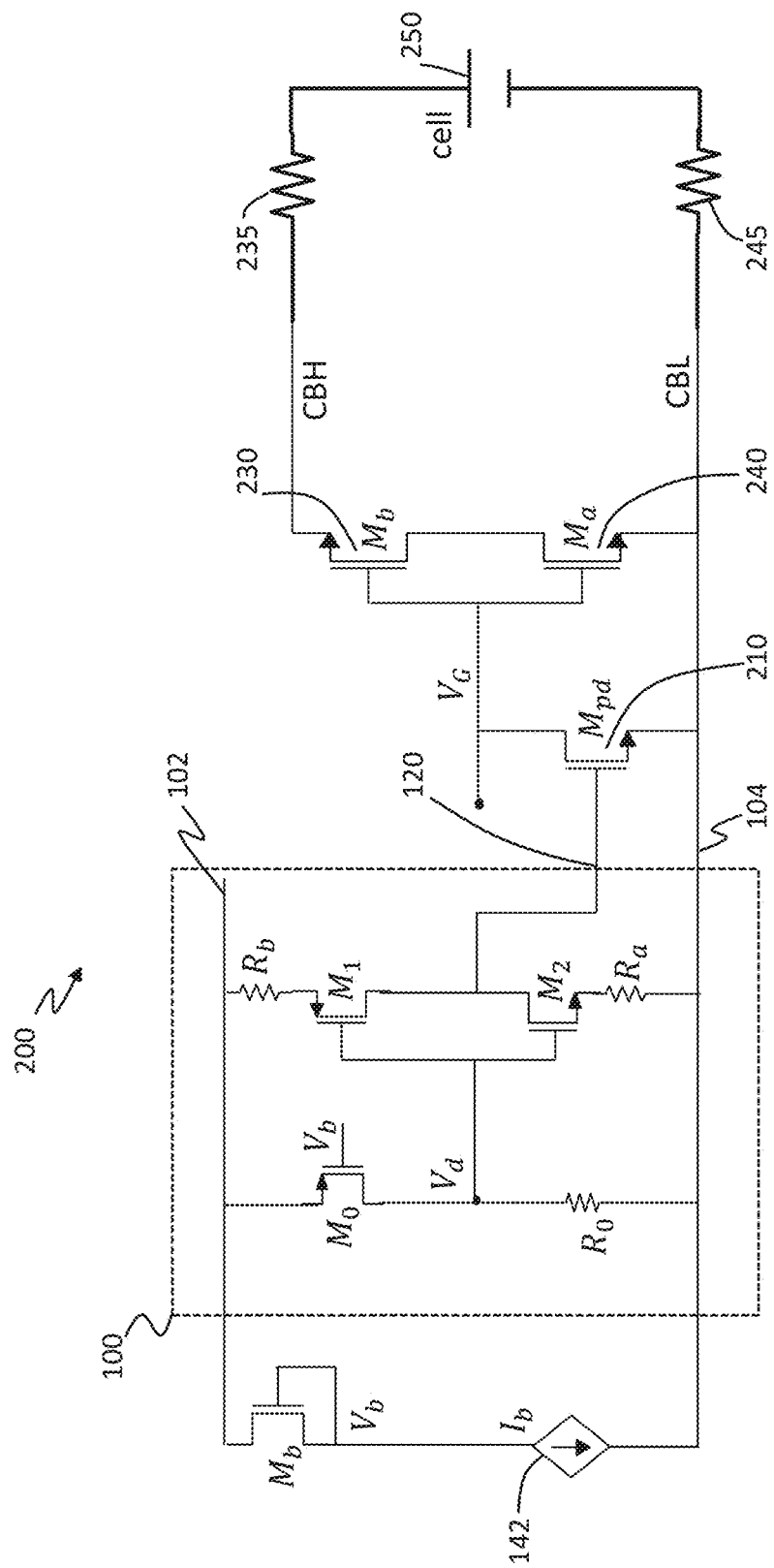
FIG. 2 shows an example of an application of the circuit of FIG. 1.

FIG. 2 shows a nonlimiting example 200 of an application of the circuit 100. In this instance the application is for a cell balancing circuit, which may for example form part of a battery management control system. The output node of the circuit 100 is connected to the control terminal of a pulldown transistor Mpd 210, such that the pulldown transistor Mpd 210 has a control signal which is an inverted copy of the drive signal. A gate drive signal $V_G$ is used to control two series connected transistors 230 and 240, which are connected to respective terminals of a cell 250 through balancing resistors 235 and 245 respectively. In operation, the controlled current source 142 results in a bias voltage Vb which is aligned (as regards timing) with the gate drive signal $V_G$. As a result the timing of the drive signal Vd is also aligned with the gate voltage $V_G$. The pulldown resistor 210 is included in order to ensure the gate voltage $V_G$ remains low when required. However such a circuit is susceptible to noisy environments, as will be discussed further hereinbelow.

Figure 3:
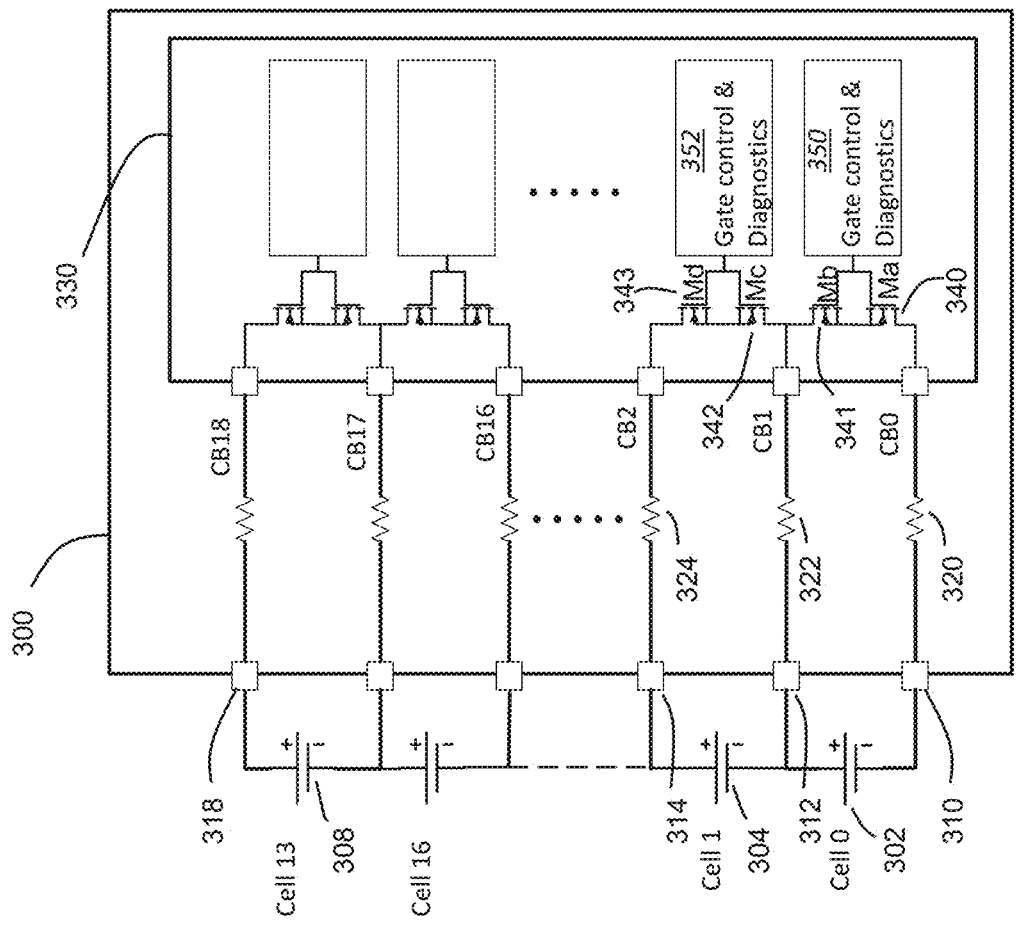
FIG. 3 depicts a simplified schematic diagram of an example battery management system in which a circuit according to one or more embodiments may be used to advantage.

Turning now to FIG. 3, this depicts a simplified schematic diagram of an example battery management system in which a circuit according to one or more embodiments may be used to advantage. The skilled person will appreciate that embodiments of the present invention may be used in other applications and the present disclosure is not limited to battery management applications such as that shown in FIG. 3, but extends to other drive applications, particular those in which low cross conduction current inverters are needed where noise is an issue, for example IGBT gate driver circuits. The application depicted in FIG. 3 is a part of multi-cell battery management system and in particular shows, schematically, circuitry 300 for balancing the state of charge of a plurality of cells (cell0 302, cell1 304 through cell13 308 in a battery stack).

In the battery stack, the cells are connected in series, and the control circuitry includes input terminals 312, 314, etc. for connection to each intercell node, that is to each of the nodes between neighbouring pairs of cells of the battery stack, along with bottom and top input terminals 310 and 318 connection to the bottom and top of the battery stack respectively. The circuitry includes resistors 320, 322, etc. connecting each of the intercell node terminals 310, 312, etc. to a corresponding terminal (CB0, CB1, etc.) of a control circuit 330. Control circuit 330 may be implemented for instance as a control IC. The control circuit includes a pair of balancing transistors between each neighbouring terminal. For instance, a pair of transistors Ma 340 and Mb 341 are connected in series between the terminal CB0 and CB1;

similarly, a pair of transistors Mc 342 and Md 343 are connected in series between terminals CB1 and CB2, and so on. Ma may correspond to the balancing transistor 240 depicted in FIG. 2. Similarly, Mb may correspond to the balancing transistor 230 depicted in FIG. 2. Balancing transistors Ma and Mb are controlled by gate drive control and diagnostics 350, balancing transistors Mc and Md are controlled by gate drive control and diagnostics 352, and so on for each transistor pair between each terminal CBn.

In operation, measurement chains (not shown, but typically in control circuit 330) are used to measure the voltage across terminals CB0 and CB1, CB1 and CB2, etc. In the event of determining different voltages, which may for instance be indicative of different states of charge of the cells in the battery stack, gate driver controls 350, 352 etc. are used to selectively close neighbouring pairs of transistors (Ma and Mb, or Mc and Md, for example), typically for relatively short periods of time, in order to partially discharge the relevant cell through the relevant pair of balancing resistors (320 and 322, or 322 and 324, for example). It will be appreciated that embodiments of the disclosure, and in particular example such as that shown in FIG. 3, may be beneficially applied in order to prevent undesirable and unintentional opening closing of one or more of the switches M1 or M2 which could otherwise occur, particularly so in noisy environments such as operation of an automobile or vehicle.

Figure 4:
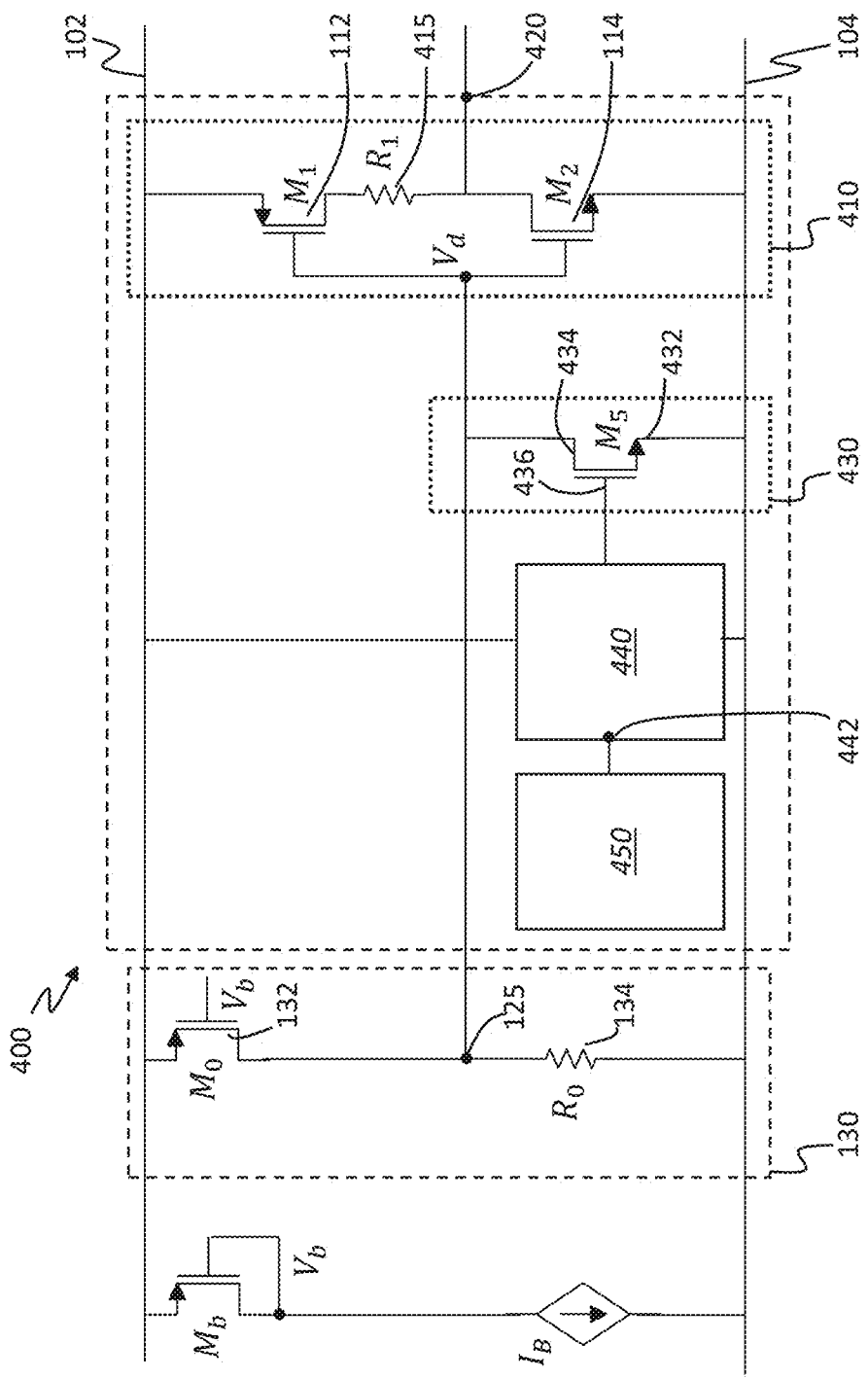
FIG. 4 shows a block diagram of an example of a circuit for reducing inverter cross-conduction current, according to one or more embodiments of the present disclosure.

Returning to FIG. 1 and FIG. 2, it will be appreciated that, since they have commonly connected gates, and one is implemented as a PMOS transistor and the other as an NMOS transistor, in general one and only one of M1 and M2 will be on at any given moment, in steady state. There is negligible or no "cross-conduction" current between the reference rails 102 and 104, since this results only from leakage current. However, during switching between output states (such as from high output to a low output), there may non-zero cross-conduction current or breakthrough current. In particular there may be a transitory current arising, for instance, from the non-zero slew rate of the transistors. Furthermore, in noisy environments, such as generally exist in battery management systems for automotive applications for example, in which the drive voltage to the inverter is subject to noise or interference, the switching moments and timing of the transistors may be disturbed, resulting in an increase in the cross-conduction current which may be an exacerbation of the problem FIG. 4 shows a block diagram of an example of a circuit 400, for reducing inverter cross-conduction current, according to one or more embodiments of the present disclosure. The circuit comprises an inverter 410 comprising a first inverter transistor M1 112 and a second inventor transistor M2 114, each having a gate terminal connected in common to a drive node Vd 125. In the example shown, M1 is PMOS and M2 is NMOS, although in other applications, it may be that M1 is NMOS and M2 is PMOS. The transistors each have a source terminal, connected to a first voltage rail 102 and a second voltage rail 104 respectively. In one or more applications, the second voltage rail may be a ground or local ground, or a floating ground. The first voltage rail may be in a range of 3-5 V higher than the second voltage rail. The transistors each having a drain terminal connected to a common first resistor R1 415. That is to say M1 is connected to a first terminal of the common first resistor 415 and M2 is connected to the other terminal of the resistor. The resistor 415 may be described as a cross-conduction resistor, since its inclusion limits cross-conduction current through the inverter transistors while they are switching. An inverter output node 420 is connected between the first resistor and the source terminal of a one of the first and second transistors. This one may conveniently be referred to as a shorting transistor, since when is it "on", which is equivalent to considering it as a switch which in this state is closed, it shorts the inverter output node 420 to one of the first and second voltage rails 102 and 104. In the nonlimiting example shown in FIG. 4, the shorting transistor is the transistor M2 114. The first resistor R1 acts to limit cross-conduction current which occurs, as a transient, should M1 and M2 be "on" (that is to say, having a "closed" switch state) or partially on at the same time. The resistance value of the first resistor may be chosen to suit the application. In an example application, for a pulldown resistor for a battery management system balancing circuit, the resistor may be chosen to have a value between 100 kOhm and 2 MOhm, or between 500 kOhm and 1 MOhm, and in particular 2,600 kOhm has been found experimentally to be a suitable value.

The circuit 400 further comprises a tying transistor M5 430 connected between the drive node and the one of the first and second voltage rail to which the shorting one of the first and second transistors is connected. That is to say its main terminals are connected, one to the drive node and the other to the voltage rail. In the example shown in FIG. 4, the tying transistor source terminal 432 is connected to the second voltage rail 104 and its drain terminal 434 is connected to the drive voltage node. The tying transistor has a tying transistor control terminal 436. In the example shown in FIG. 4, the tying transistor is an NMOS transistor. The skilled person will appreciate that the type (NMOS or PMOS) of the trying transistor will typically and conveniently be the same as the type of the shorting transistor. Stated another way, whether the shorting resistor is placed on the PMOS or NMOS side of the inverter dictates which embodiment of the invention should be used (NMOS tying transistor or PMOS tying transistor).

The circuit further comprises a biasing circuit 440. As shown in the figure, the biasing circuit 440 is connected between the first and second voltage rails, and an output of the biasing circuit 440 is connected to the tying transistor control terminal. The biasing circuit is configured to be controlled by a local drive signal provided at an input 442. The biasing circuit is configured to, in operation, bias the tying transistor control terminal to a voltage such that the tying transistor ties the drive node to the one of the first and second voltage rail in response to the drive signal having a first state. Thus, in the example shown in the figure, the biasing circuit is configured to bias the tying transistor control terminal high to switch on the tying resistor M5 when the inverter input is low, since the transistor shown in FIG. 4 is NMOS and normally off, and only turned on by a high signal on the gate. In other embodiments, such as that shown in FIG. 7 below, the tying transistor may alternatively be PMOS.

The circuit 400 further comprises a local drive circuit 450. The local drive circuit 450 is configured to provide the local drive signal at the input 442 of the biasing circuit 440. Although in theory the local drive circuit 450 could be used to drive the inverter itself—that is to say circuit 450 could correspond to the drive circuit 130 in FIG. 1—in practical implementations this has found to cause feedback and instability problems. It is thus preferred that the local drive circuit is separate and distinct from the drive circuit 130 which provides the drive signal Vd.

Figure 5:
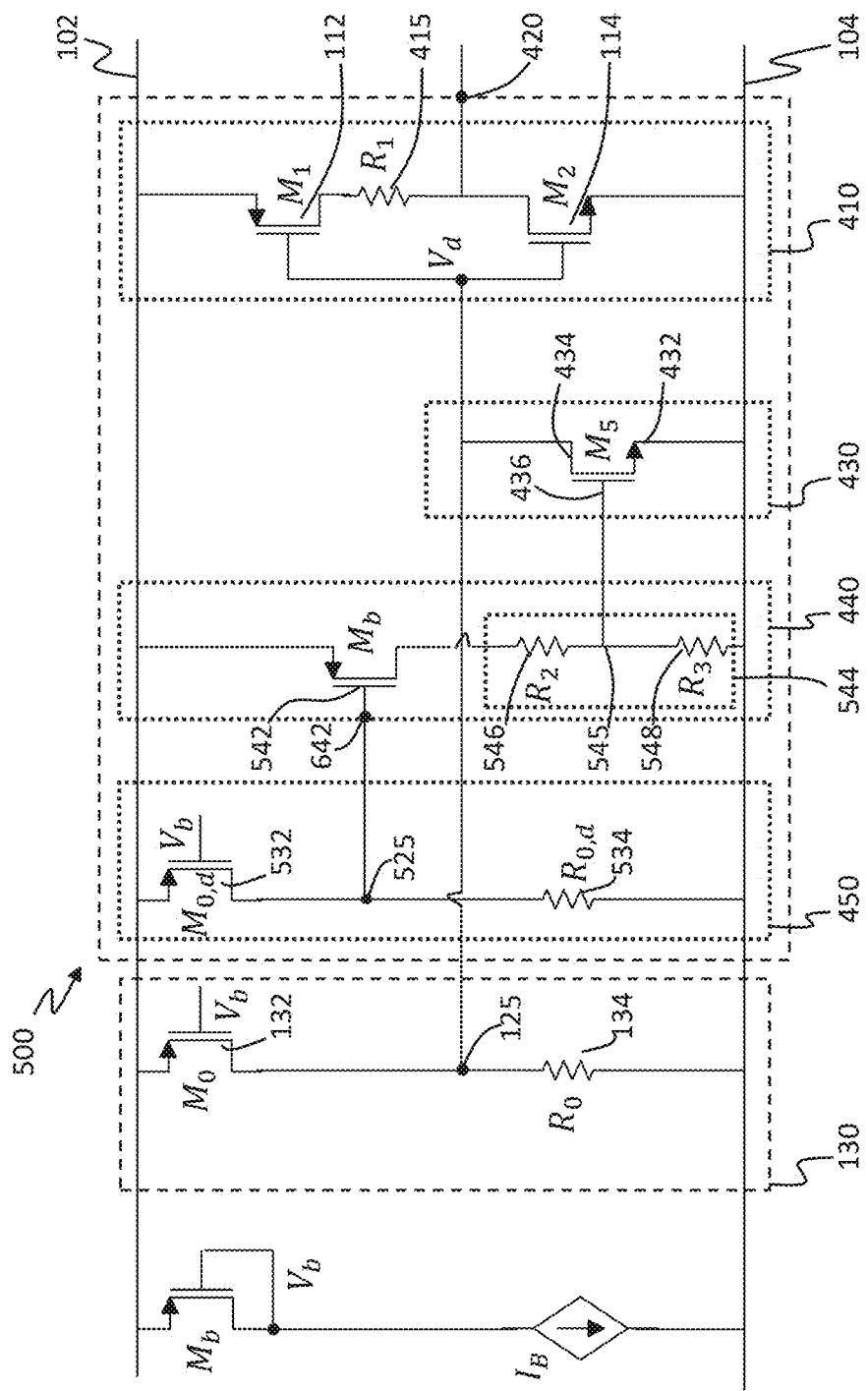
FIG. 5 shows an example circuit diagram of one or more embodiments.

FIG. 5 shows an example circuit diagram 500 of one or more embodiments of the present disclosure, and in particular one or more embodiments which implements the block diagram shown in FIG. 4. The inverter 410 comprising the two transistors 112 and 114 is the same as that shown in FIG. 4, as is the tying transistor M5 430, which again in this case is used to tie the inverter input to the second voltage rail 104 when the drive signal is low.

The circuit shown in FIG. 5 includes a biasing circuit 440 comprising a series arrangement of a biasing transistor Mb 542 and a voltage divider 544, the series arrangement being connected between the first voltage rail and the second voltage rail. In this example the biasing transistor Mb is a PMOS transistor and is connected by its source to the first voltage rail and by its drain to the voltage divider 544. In this example, voltage divider comprises two resistors R2 546 and R3 548 with a divider output node 545 therebetween. The divider output node is connected to the tying transistor control terminal. The biasing transistor comprises a control terminal configured to be connected to the local drive signal. In operation, the transistor Mb is normally on when the local drive signal is low, and thus when the drive signal is low since the local drive signal is a copy or duplicate of the drive signal. The voltage divider is then connected between the two voltage rails, thereby giving a relatively high signal to the gate of the tying transistor, thereby turning the tying transistor M5 off. Providing R2 & R3 with values of 50 MOhm has been found to be effective in a simulation.

The local drive circuit 450 is a copy of the drive circuit 130. In particular it comprises a series arrangement of a transistor M0,d 532 and a resistor R0,d 534 between the first and second voltage rails. The local drive node 525 between the transistor M0,d 532 and resistor R0,d 534 provides the drive to the biasing circuit 440, at biasing circuit input 442.

The drive signal Vd is provided by the drive circuit 130 comprising a transistor M0 132 connected between the drive node and a first voltage rail, together with a resistor R0 134 connected between the drive node and the second rail. That is to say the transistor M0 has its source terminal connected to the first voltage rail 102, and its drain terminal connected to the drive node 125. It has a drive transistor control terminal 136 connected to the input signal voltage Vb.

The skilled person will appreciate that the local drive circuit 450 is a copy of the drive circuit 130. The drive circuit may be a duplicate of the drive circuit, that is to say the transistor M0,d 532 may be the same as transistor M0 132, and resistor R0,d 534 may be the same as resistor R0 134; however the skilled person will also appreciate that different dimensions and/or values may be chosen for the transistor and resistor, to suit a particular application.

Figure 6:
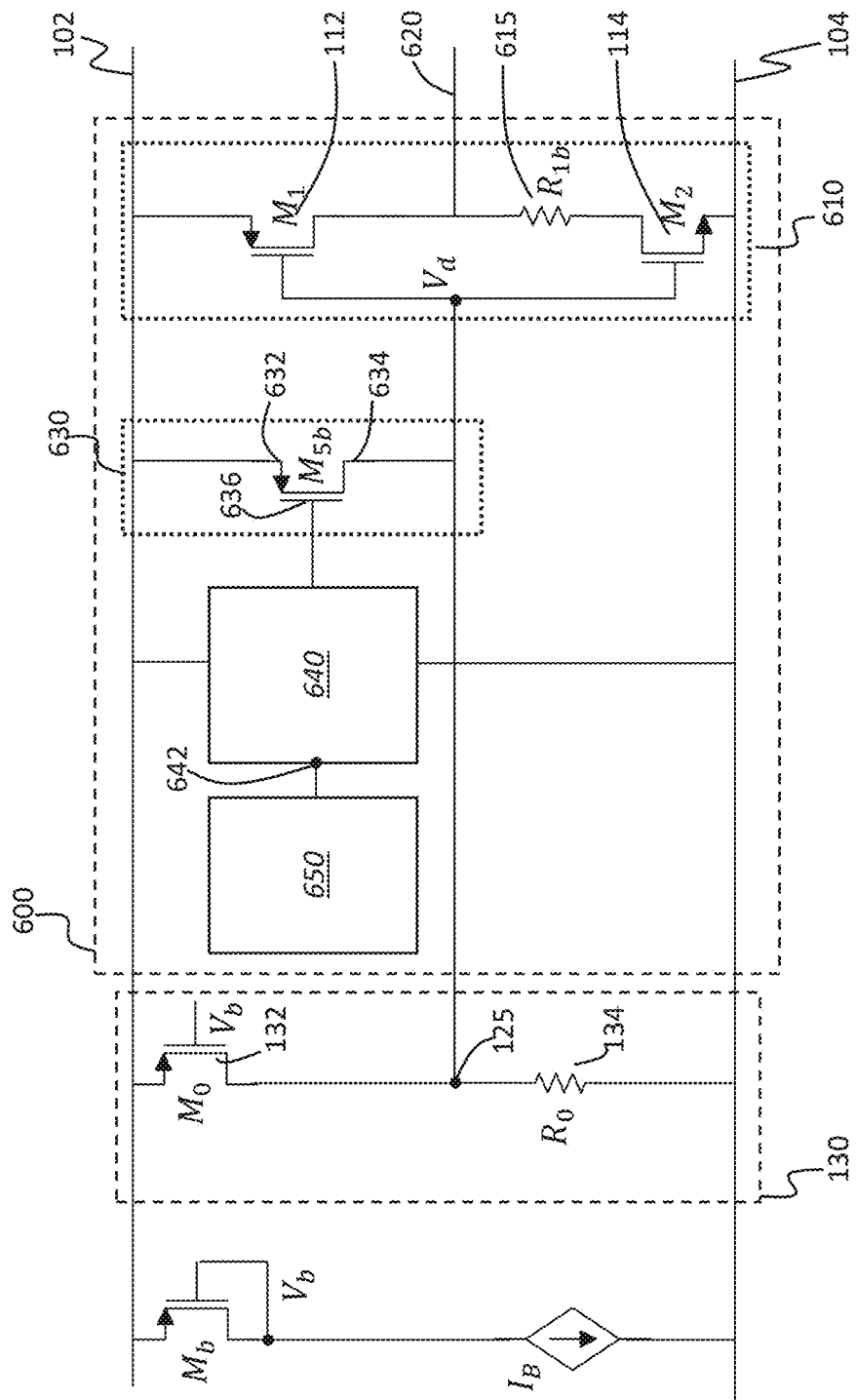
FIG. 6 shows a block diagram of an example of a circuit for reducing inverter cross-conduction current, according to one or more other embodiments.

FIG. 6 shows a block diagram of an example of a circuit 600 for reducing inverter cross-conduction current, according to one or more other embodiments of the present disclosure. This circuit is similar to that shown in FIG. 4, it includes an inverter 610 comprising first inverter transistor M1 112 and second inverter transistor M2 114, with a resistor R1 615 therebetween, however in this instance the output node 620 is connected directly to transistor M1 112 and the resistor is between the output node 620 and the resistor M2 114.

Circuit 600 further comprises a tying transistor M5b 630 having its main terminals connected, one to the drive node and the other to the voltage rail. In contrast to the circuit of FIG. 4, the tying resistor M5b 630 is between the drive node and the first voltage rail 102. That is to say the tying transistor source terminal 632 is connected to the second voltage rail 102 and its drain terminal 634 is connected to the drive voltage node. The tying transistor has a tying transistor control terminal 636. In the example shown in FIG. 6, the tying transistor is an PMOS transistor.

Similar to the example shown in FIG. 4, the tying transistor M5b 630 is controlled, at its control terminal gate, by a biasing circuit 640, which is itself driven by a local drive signal which is provided at input 642 of a local drive circuit 650.

Figure 7:
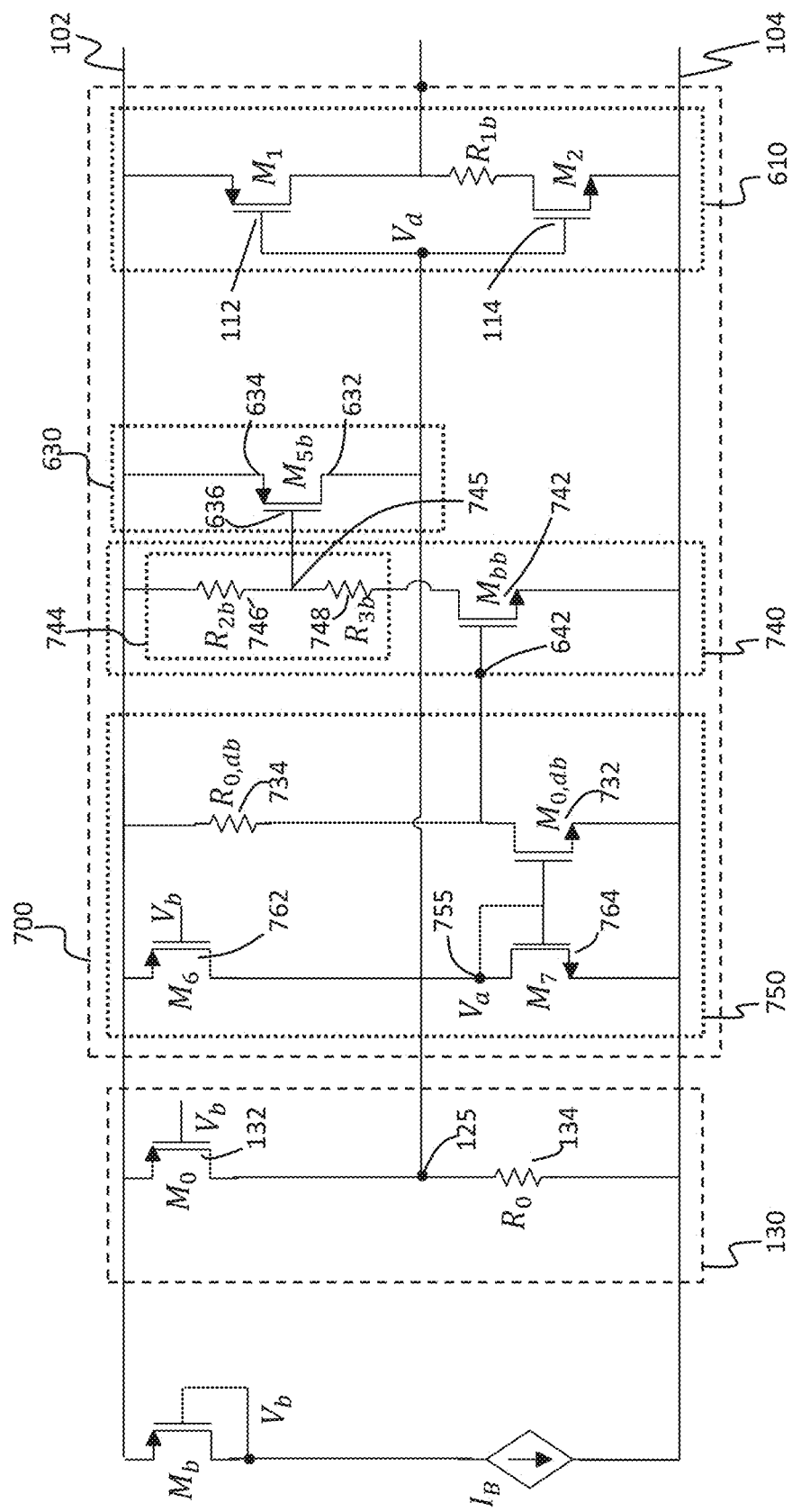
FIG. 7 shows an example circuit diagram of one or more embodiments, and in particular embodiments which implements the block diagram shown in FIG. 6.

FIG. 7 shows an example circuit diagram 700 of one or more embodiments of the present disclosure, and in particular one or more embodiments which implements the block diagram shown in FIG. 6. The inverter 610 comprising the two transistors 112 and 114 is the same as that shown in FIG. 4, as is the tying transistor M5 430, which again in this case is used to tie the inverter input to the first voltage rail 102 when the drive signal is high.

Similarly, the circuit shown in FIG. 7 includes a biasing circuit 740 comprising a series arrangement of a biasing transistor Mbb 742 and a voltage divider 744, the series arrangement being connected between the first voltage rail and the second voltage rail. In this example the biasing transistor Mbb is a NMOS transistor and is connected by its source to the second voltage rail and by its drain to the voltage divider 744. The voltage divider comprises two resistors R2 746 and R3 748 with a divider output node 745 therebetween. The divider output node is connected to the tying transistor control terminal. The biasing transistor comprises a control terminal configured to be connected to the local drive signal. In operation, the transistor Mbb is normally on when the local drive signal is low, and thus when the drive signal is low since the local drive signal is a copy or duplicate of the drive signal. The voltage divider is then connected between the two voltage rails, thereby giving a relatively high signal to the gate of the tying transistor, thereby turning the tying transistor M3 off.

The local drive signal is provided at the biasing circuit input 642 by a local drive circuit 750. This circuit differs from the drive circuit 450 in that the input signal voltage Vb is not input directly into the circuit leg comprising a series arrangement of transistor M0,db 732 and resistor R0,db 734. Instead this input is provided to a current mirror circuit comprising a second series-connected pair of transistors M6 762 and M7 764, arranged as a second leg in parallel with transistor M0,db 732 and resistor R0,db 734. The input signal voltage Vb is provided to the control terminal of transistor M6 762. The source of transistor 742 is connected to the first voltage rail 102, and the drain of the transistor is connected with to drain of the second transistor M7 in this leg. The source of M7 764 is connected to the second voltage rail 104. The gate of transistor M7 is connected to its drain, at a node 755 having voltage Va. The gate of M7 is also connected to the gate of transistor M0,db 732 in the first leg, in order to provide a current mirror so the current in the first leg matches that in the second leg. The local drive signal is provided to the biasing circuit input 642 from the node between transistor M0,db 732 and resistor R0,db 734.

In operation, in a configuration where the shorting resistor R1 is needed on the M2 side of the inverter, the inverter exhibits a pull down capability that is much lower that its pull up capability. In this case, when the input of the inverter in high, that is to say that M2 is ON and M1 OFF, noise at the input of the inverter could make it easy for M1 to turn on and thus pull the output of the inverter up due to its relatively higher pull up capability. To deal with this problem, a PMOS tying resistor is needed at the input of the inverter which maintains it at a higher state.

Figure 8:
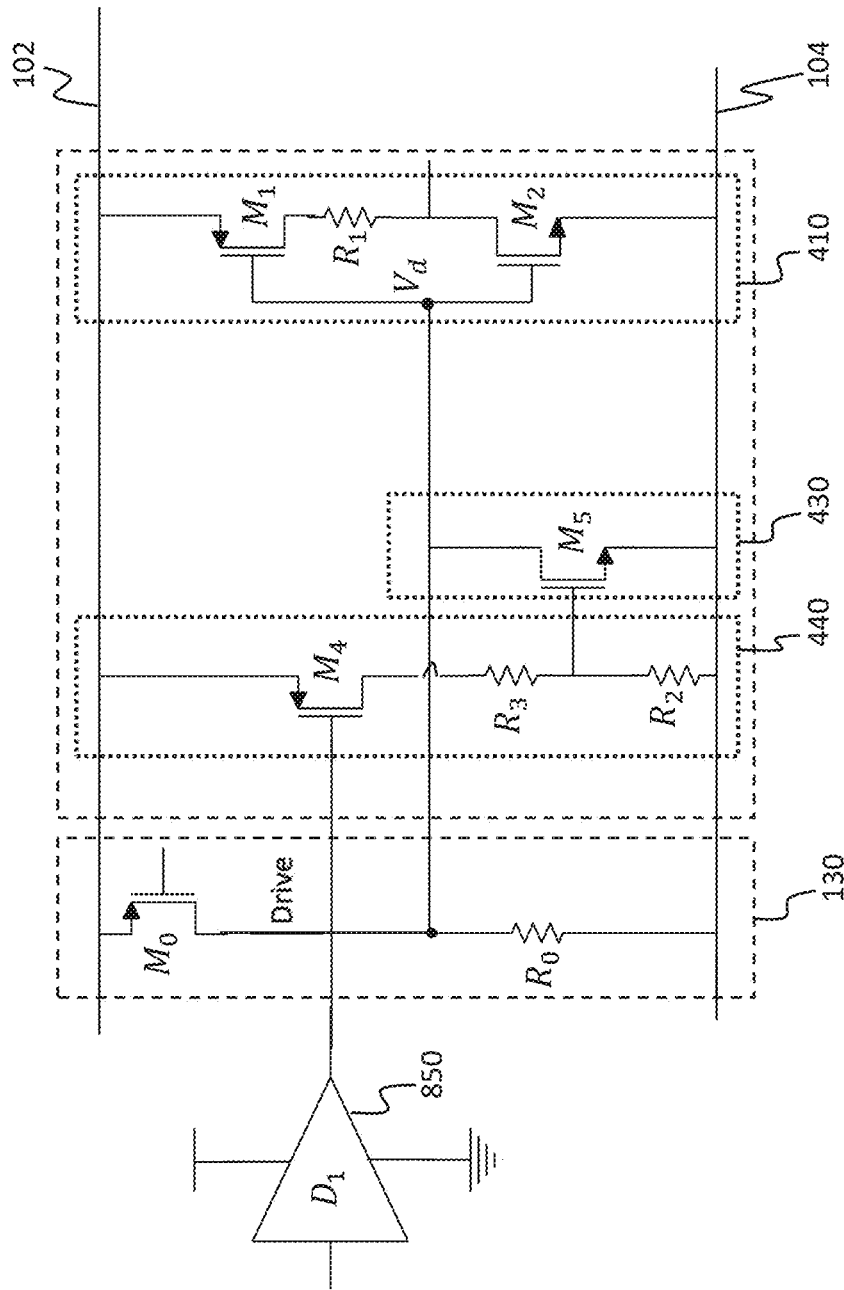
FIG. 8 shows a further circuit according to one or more embodiments.

FIG. 8 shows a further circuit according to one or more embodiments of the present disclosure. This circuit is similar to that shown in FIG. 4, and includes the inverter 410, and biasing circuit 440 between first and second voltage rail 102 and 104. Similar to the embodiment shown in FIG. 4, the shorting resistor R1 shown is between the inverter output node and the second voltage rail 104. The tying resistor M5 430 is also between the drive node and the second voltage rail 104. As shown, the drive signal for the biasing circuit may be provided by a separate drive circuit D1 850, which is not a copy of the drive circuit 130, nor a current mirrored adaptation of such a circuit (such as that shown in FIG. 7 with respect to the tie-up version).

Figure 9:
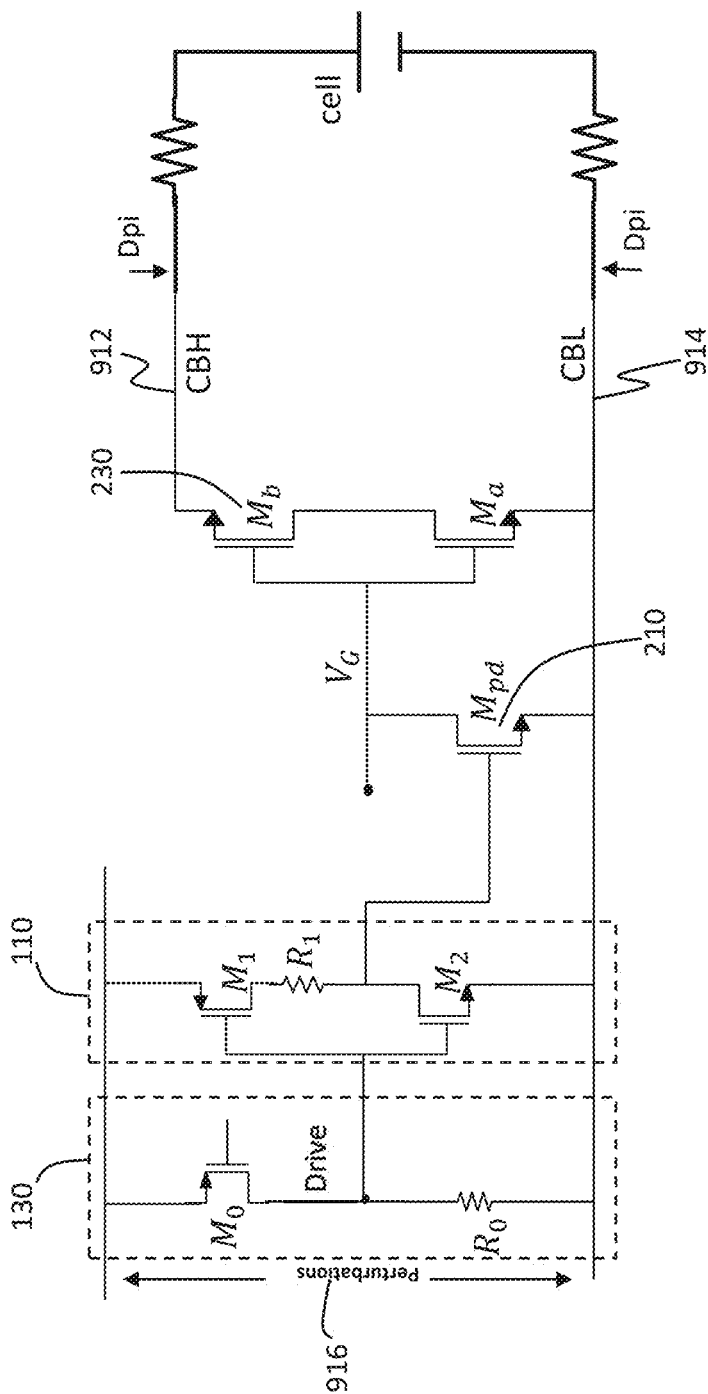
FIG. 9 shows an application circuit for a circuit for a conventional battery management system.

FIG. 9 shows an application circuit for a circuit for a conventional battery management system, in which perturbations, such as direct power injection (DPI) are introduced into one or more of the current balancing high (CBH) rail 912 and current balancing low (CBL) rail 914, or as shown as 916 into the drive circuit 130 for the inverter 110 to control the pulldown transistor Mpd 210.

FIGS. 10 and 11 shows the resulting gate-source voltages, plotted against time for the pulldown transistor Mpd 210 and the upper balancing transistor Mb 230, for a conventional pulldown control circuit comprising inverter 110 and drive 130. As can be seen, upon the introduction of the perturbation at 275 ms, the gate voltage on the pulldown transistor Mpd 210 becomes noisy, and varies between +0.5 V and −0.5 V. The effect on the upper balancing transistor 230 is noticeable, and in particular the gate-source voltage starts to rise such that within approximately 10-40 ms it has reached a value of 0.6-0.8 V, which may be sufficient to turn on the transistor, which, it will be appreciated is an unwanted and potentially undesirable effect.

Figure 12:
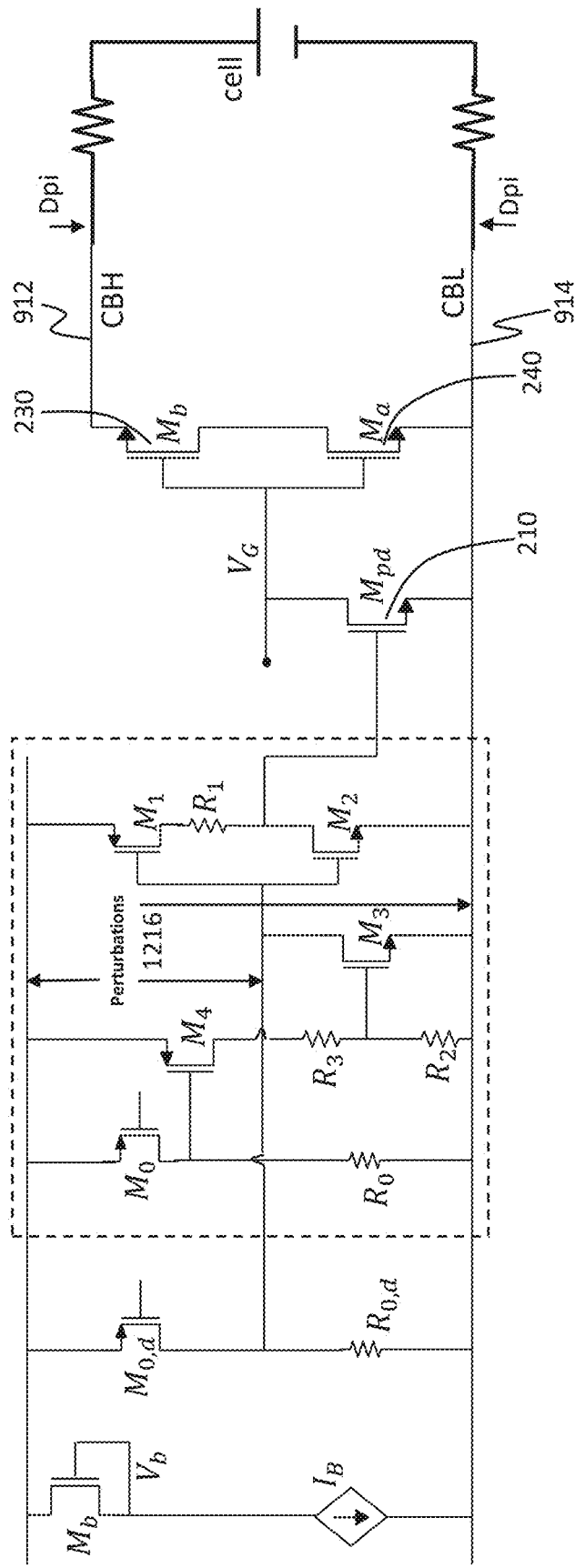
FIG. 12 shows an application circuit for a circuit to one or more embodiments, for the same battery management system.

In contrast FIG. 12 shows an application circuit for a circuit according to one or more embodiments, for the same battery management system, in which perturbations, such as direct power injection (DPI) are introduced into one or more of the current balancing high (CBH) rail 912 and current balancing low (CBL) rail 914, or, as shown at 1216, into the drive circuit 130 for the inverter 110 to control the pulldown transistor Mpd 210.

Figures 13, 14:
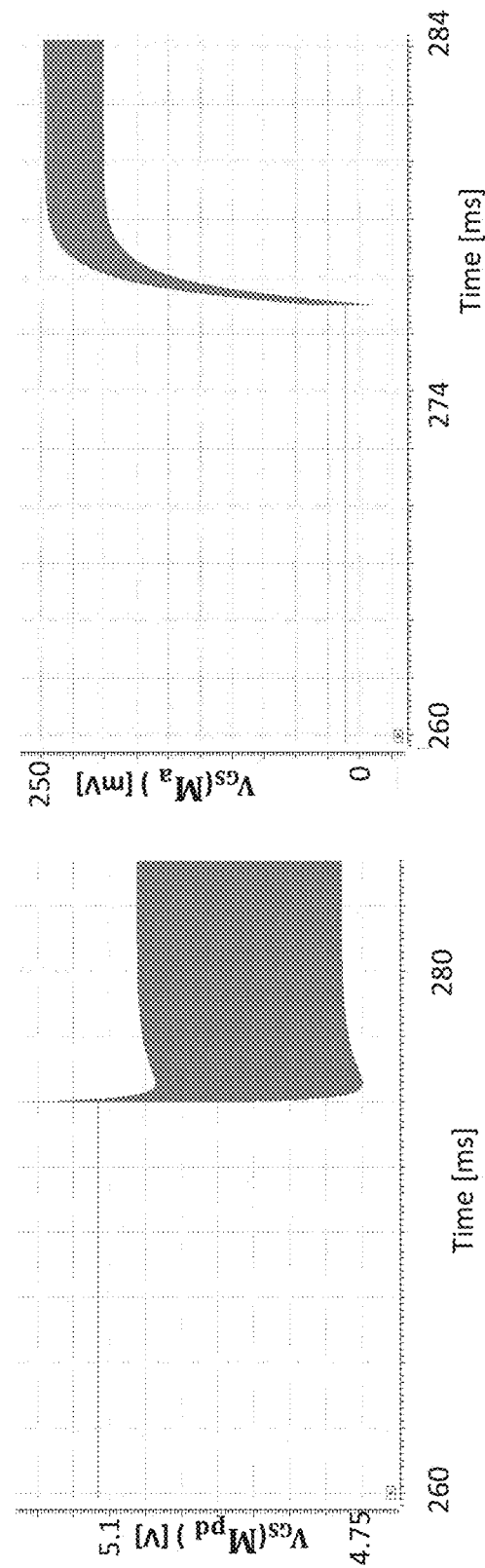
FIGS. 13 and 14 shows the resulting gate-source voltages, plotted against time for the pulldown transistor and the upper balancing transistor, for the circuit of FIG. 12.

FIGS. 13 and 14 shows the resulting gate-source voltages, plotted against time for the pulldown transistor Mpd 210 and the lower balancing transistor Ma 240, for the circuit of FIG. 12. As can be seen, upon the introduction of the perturbation at 275 ms, the gate voltage on the pulldown transistor Mpd 210 starts to include some noise, and varies between +4.75-5.05. However, this variation is far less than in the conventional case The effect on the upper balancing transistor 230 is far smaller, and in particular the rise in the gate-source voltage rapidly flattens off, achieving no more than about 0.25 V. Such a minimal voltage change is clearly insufficient to turn on the transistor.

From reading the present disclosure, other variations and modifications will be apparent to the skilled person. Such variations and modifications may involve equivalent and other features which are already known in the art of clamping or stabilizer circuits, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

It is noted that one or more embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Features which are described in the context of separate embodiments may also be provided in combination in a single embodiment. Conversely, various features which are, for brevity, described in the context of a single embodiment, may also be provided separately or in any suitable sub-combination.

For the sake of completeness it is also stated that the term "comprising" does not exclude other elements or steps, the term "a" or "an" does not exclude a plurality, a single processor or other unit may fulfil the functions of several means recited in the claims [delete if not relevant] and reference signs in the claims shall not be construed as limiting the scope of the claims. Furthermore, the word "may" is used in a permissive sense (i.e., meaning having the potential to), rather than the mandatory sense (i.e., meaning must). Similarly, the words "include," "including," and "includes" mean including, but not limited to.

LIST OF REFERENCE SIGNS a. 100 circuit
b. 102 first voltage rail
c. 104 second voltage rail
d. 110 inverter
e. 112 transistor M1
f. 114 transistor M2
g. 116 resistor Ra
h. 118 resistor Rb
i. 120 inverter output node
j. 125 drive node/inverter drive node
k. 130 drive circuit
l. 132 transistor M0
m. 134 resistor R0
n. 142 controlled current source
o. 144 transistor Mb
p. 200 application circuit
q. 210 pulldown resistor Mpd
r. 230 transistor
s. 235 balancing resistor
t. 240 transistor
u. 245 balancing resistor
v. 250 cell
w. 300 cell balancing circuitry
x. 302, 304,308 cell
y. 310 bottom input terminal
z. 312, 314 intercell node terminal
aa. 318 bottom top input terminal
bb. 320, 322 resistor
cc. 330 control circuit
dd. 340, 341 balancing transistors
ee. 342, 343 balancing transistors
ff. 350, 352 gate drive control and diagnostics
gg. 400 block diagram circuit for tie-down
hh. 410 inverter
ii. 415 cross-conduction resistor
jj. 420 inverter node
kk. 430 tying transistor M5 ll. 432 tying transistor source terminal
mm. 434 tying transistor drain terminal
nn. 436 tying transistor control terminal
oo. 440 biasing circuit
pp 442 biasing circuit input
qq. 450 local drive circuit
rr. 500 circuit for tie-down
ss. 525 local drive node
tt. 532 transistor M0,d
uu. 534 resistor R0,d
vv. 542 biasing transistor Mb
ww. 544 voltage divider
xx. 545 divider output node
yy. 546 voltage divider resistor R2
zz. 548 voltage divider resistor R3
aaa. 600 block diagram circuit for tie-up
bbb. 610 inverter
ccc. 615 resistor R1
ddd. 620 output node
eee. 630 tying transistor M5b
fff. 632 tying transistor source terminal
ggg. 634 tying transistor drain terminal
hhh. 636 tying transistor control terminal
iii. 640 biasing circuit
jjj. 642 biasing circuit input
kkk. 650 local drive circuit
lll. 700 circuit for tie-up
mmm. 732 transistor M0,db
nnn. 734 resistor R0,db
ooo. 742 biasing transistor Mb
ppp. 744 voltage divider
qqq. 745 divider output node
rrr. 746 voltage divider resistor R2
sss. 748 voltage divider resistor R3
ttt. 750 local drive circuit
uuu. 755 node for voltage Va
vvv. 762 transistor M6
www. 764 transistor M7
xxx. 850 local drive circuit
yyy. 912 cell balance high rail
zzz. 914 cell balance low rail
aaaa. 916 dpi perturbations
bbbb. 1216 dpi perturbations

The invention claimed is:
1. A circuit, comprising:
a. an inverter comprising a first inverter transistor and a second inverter transistor, each having a gate terminal connected in common to a drive node, each having a source terminal, connected to a first voltage rail and a second voltage rail respectively, and each having a drain terminal connected to a common first resistor, the inverter having an inverter output node between the first resistor and the drain terminal of a shorting one of the first and second inverter transistors;
b. a tying transistor connected between the drive node and one of the first and second voltage rails to which the shorting one of the first and second inverter transistors is connected, the tying transistor having a tying transistor control terminal;
c. a biasing circuit connected to the tying transistor control terminal and configured to be controlled by a local drive signal, the biasing circuit being configured to bias the tying transistor control terminal to a voltage such that the tying transistor ties the drive node of the one of the first and second voltage rails in response to the local drive signal having a first state;
d. a local drive circuit configured to provide the local drive signal;
e. a further drive circuit;
f. wherein the local drive circuit is a duplicate of the further drive circuit.

2. The circuit of claim 1, wherein the biasing circuit comprises a series arrangement of a biasing transistor and a voltage divider, the series arrangement being connected between the first voltage rail and the second voltage rail, wherein the voltage divider has a divider output node connected to the tying transistor control terminal, and wherein the biasing transistor comprises a control terminal configured to be connected to the local drive signal.

3. The circuit of claim 2, wherein the voltage divider comprises a second resistor and a third resistor with the divider output node therebetween, wherein the second resistor has a resistance value which is within 10% of a resistance value of the third resistor.

4. A circuit, comprising:
an inverter comprising a first inverter transistor and a second inverter transistor, each having a gate terminal connected in common to a drive node, each having a source terminal, connected to a first voltage rail and a second voltage rail respectively, and each having a drain terminal connected to a common first resistor, the inverter having an inverter output node between the first resistor and the drain terminal of a shorting one of the first and second inverter transistors;
a tying transistor connected between the drive node and one of the first and second voltage rails to which the shorting one of the first and second inverter transistors is connected, the tying transistor having a tying transistor control terminal;
a biasing circuit connected to the tying transistor control terminal and configured to be controlled by a local drive signal, the biasing circuit being configured to bias the tying transistor control terminal to a voltage such that the tying transistor ties the drive node of the one of the first and second voltage rails in response to the local drive signal having a first state; and
a local drive circuit configured to provide the local drive signal;
wherein the biasing circuit comprises a series arrangement of a biasing transistor and a voltage divider, the series arrangement being connected between the first voltage rail and the second voltage rail, wherein the voltage divider has a divider output node connected to the tying transistor control terminal, and wherein the biasing transistor comprises a control terminal configured to be connected to the local drive signal;
wherein the voltage divider comprises a second resistor and a third resistor with the divider output node therebetween;
wherein the second resistor has a resistance value which is at least 10 times a resistance value of the first resistor.

5. The circuit of claim 1 wherein the first resistor has a resistance value of at least 500 kOhm.

6. The circuit of claim 1, wherein the inverter output node is connected between the first resistor and the drain terminal of the second inverter transistor, and the first state is a voltage low state.

7. The circuit of claim 1, wherein the second voltage rail is a floating ground voltage, and the first voltage rail is in a range of 3-5 V higher than the floating ground voltage.

8. The circuit of claim 1, wherein the first inverter transistor is an NMOS transistor.

9. The circuit of claim 8, wherein the tying transistor is a PMOS transistor.

10. The circuit of claim 1, operable as a gate control circuit, and further comprising a gate pull-down transistor having a control terminal connected to the inverter output node.

11. The circuit of claim 10, further comprising a further drive circuit.

12. A circuit, comprising:
- an inverter comprising a first inverter transistor and a second inverter transistor, each having a gate terminal connected in common to a drive node, each having a source terminal, connected to a first voltage rail and a second voltage rail respectively, and each having a drain terminal connected to a common first resistor, the inverter having an inverter output node between the first resistor and the drain terminal of a shorting one of the first and second inverter transistors;
- a tying transistor connected between the drive node and one of the first and second voltage rails to which the shorting one of the first and second inverter transistors is connected, the tying transistor having a tying transistor control terminal;
- a biasing circuit connected to the tying transistor control terminal and configured to be controlled by a local drive signal, the biasing circuit being configured to bias the tying transistor control terminal to a voltage such that the tying transistor ties the drive node of the one of the first and second voltage rails in response to the local drive signal having a first state; and
- a local drive circuit configured to provide the local drive signal;
- a further drive circuit, wherein the further drive circuit comprises a drive transistor connected in series with a fourth resistor with a second drive node therebetween, the drive transistor connected between the first voltage rail and the second drive node, and the fourth resistor being connected between the second drive node and the second voltage rail, wherein the further drive circuit is configured to receive an input signal at a control terminal of the drive transistor, and provide a gate driver drive signal at the second drive node.

13. The circuit of claim 4, further comprising a further drive circuit, wherein the local drive circuit is a duplicate of the further drive circuit.

14. The circuit of claim 12 wherein the first resistor has a resistance value of at least 500 kOhm.

15. The circuit of claim 12, wherein the inverter output node is connected between the first resistor and the drain terminal of the second inverter transistor, and the first state is a voltage low state.

16. The circuit of claim 12, wherein the second voltage rail is a floating ground voltage, and the first voltage rail is in a range of 3-5 V higher than the floating ground voltage.

17. The circuit of claim 12, wherein the first inverter transistor is an NMOS transistor.

18. The circuit of claim 12, operable as a gate control circuit, and further comprising a gate pull-down transistor having a control terminal connected to the inverter output node.

19. The circuit of claim 12, wherein the local drive circuit is a duplicate of the further drive circuit.

20. The circuit of claim 12, wherein the biasing circuit comprises a series arrangement of a biasing transistor and a voltage divider, the series arrangement being connected between the first voltage rail and the second voltage rail, wherein the voltage divider has a divider output node connected to the tying transistor control terminal, and wherein the biasing transistor comprises a control terminal configured to be connected to the local drive signal.

21. The circuit of claim 20 wherein the voltage divider comprises a second resistor and a third resistor with the divider output node therebetween, wherein the second resistor has a resistance value which is at least 10 times a resistance value of the first resistor.

* * * * *